United States Patent
Ishitsuka et al.

(10) Patent No.: US 7,244,643 B2
(45) Date of Patent: Jul. 17, 2007

(54) SEMICONDUCTOR DEVICE AND MANUFACTURING METHOD THEREOF

(75) Inventors: Norio Ishitsuka, Tsuchiura (JP); Yukihiro Kumagai, Tsuchiura (JP); Hideo Miura, Tsuchiura (JP); Shuji Ikeda, Kodaira (JP); Toshifumi Takeda, Kodaira (JP); Hiroyuki Ohta, Tsuchiura (JP)

(73) Assignee: Hitachi, Ltd., Tokyo (JP)

( * ) Notice: Subject to any disclaimer, the term of this patent is extended or adjusted under 35 U.S.C. 154(b) by 126 days.

(21) Appl. No.: 10/496,766

(22) PCT Filed: Nov. 21, 2002

(86) PCT No.: PCT/JP02/12180

§ 371 (c)(1),
(2), (4) Date: Jan. 26, 2005

(87) PCT Pub. No.: WO03/046991

PCT Pub. Date: Jun. 5, 2003

(65) Prior Publication Data

US 2005/0121727 A1    Jun. 9, 2005

(30) Foreign Application Priority Data

Nov. 26, 2001  (JP) ............................. 2001-358656

(51) Int. Cl.
*H01L 21/8238* (2006.01)
(52) U.S. Cl. .................................................... 438/199
(58) Field of Classification Search ............... 438/164, 438/199; 327/264; 257/374
See application file for complete search history.

(56) References Cited

U.S. PATENT DOCUMENTS 5,670,388 A * 9/1997 Machesney et al. ........ 438/164
5,731,619 A * 3/1998 Subbanna .................... 257/374

(Continued)

FOREIGN PATENT DOCUMENTS

CN            1239324 A      12/1999

(Continued)

OTHER PUBLICATIONS

Akemi Hamada, et al., "A New Aspect of Mechanical Stress Effects in Scaled MOS Devices," IEEE Transaction On Electron Devices, vol. 38., No. 4, Apr. 1991, pp. 895-900.

*Primary Examiner*—Carl Whitehead, Jr.
*Assistant Examiner*—Monica D. Harrison
(74) *Attorney, Agent, or Firm*—Antonelli, Terry, Stout & Kraus, LLP.

(57) ABSTRACT

The object of the present invention is to provide a semiconductor device comprising an n-type channel field effect transistor and a p-type channel field effect transistor, which has a high degree of reliability and excellent drain current characteristics. The gist of the invention for attaining the object resides in disposing a silicon nitride film to the side wall of a trench for an active region in which the n-type channel field effect transistor is formed and disposing the silicon nitride film only in the direction perpendicular to the channel direction to the sidewall of the trench for the active region of the p-type channel field effect transistor. According to the present invention, a semiconductor device comprising an n-type channel field effect transistor and a p-type channel field effect transistor of excellent current characteristics can be provided.

11 Claims, 9 Drawing Sheets

U.S. PATENT DOCUMENTS

| | | | |
|---|---|---|---|
| 5,796,284 A * | 8/1998 | Clemen et al. | 327/264 |
| 6,074,903 A | 6/2000 | Rengarajan et al. | |
| 2002/0070420 A1 | 6/2002 | Oh et al. | |

FOREIGN PATENT DOCUMENTS

| | | |
|---|---|---|
| CN | 1359145 A | 7/2002 |
| EP | 0 967 636 | 12/1999 |
| EP | 1 213 757 | 6/2002 |
| JP | 01-235246 | 9/1989 |
| JP | 11-340337 | 12/1999 |
| JP | 2000-40797 | 2/2000 |
| JP | 2002-231805 | 8/2002 |
| KR | 2000-0006208 | 1/2000 |
| TW | 418487 | 1/2001 |

* cited by examiner

SEMICONDUCTOR DEVICE AND MANUFACTURING METHOD THEREOF

TECHNICAL FIELD

The present invention relates to semiconductor devices and, more in particular, it relates to a semiconductor device having an n-type channel field effect transistor and a p-type channel field effect transistor.

BACKGROUND ART

In recent years, the processing performance required for semiconductor devices such as LSI has become severer along with the progress of information communication equipment and it has been attempted to increase the operation speed of transistors. In particular, complementary field effect transistors comprising an n-type channel field effect transistor and a p-type channel field effect transistor have been used generally since they consume less electric power. Its operation speed has been increased mainly by the refinement of the structure being supported by the progress of lithography for fabricating semiconductor devices. However, the required minimum fabrication size (minimum fabrication size for gate) is reduced to less than the level of the wavelength of light used for the lithography to bring about a difficulty in further refinement of fabrication.

In view of the above, as a means for increasing the operation speed of the n-type channel field effect transistor, a method of inducing strains to silicon in the channel portion of the field effect transistor has been proposed. It has been known so far that the electron mobility (effective mass) changes when silicon crystals are strained. Japanese Patent Laid-open No. 11-340337 discloses a method of using silicon-germanium of lager lattice constant than that of silicon for the underlying film forming the field effect transistor, and epitaxially growing a silicon layer thereover thereby providing silicon to be a channel portion with strains to enhance the mobility and increase the operation speed of the transistor.

However, when materials of different lattice constants of crystals are epitaxially grown under lattice matching as described above, the strain energy caused in the crystals increases to bring about a problem of including dislocation in the crystals at a film thickness greater than a certain critical thickness. Further, adoption of an additional production apparatus caused by the introduction of unusual material of silicon-germanium increases the cost in the production process of semiconductor devices such as LSI. Thus, the method described above has not yet been put to practical use.

Further, while the complementary field effect transistor comprises an n-type channel field effect transistor using electrons as carriers and an n-type channel field effect transistor using holes as carries, it is preferred to increase the operation speed for each of the n-type channel and p-type channel transistors in order to increase the operation speed of the semiconductor device.

DISCLOSURE OF THE INVENTION

An object of the present invention is to provide a semiconductor device having an n-type channel field effect transistor and a p-type channel field effect transistor, which is excellent in the drain current characteristics.

The present invention for solving the subject described above is to be described.

(1) A semiconductor device is characterized by comprising: a field region in which an insulative film is buried to the inside of a trench formed to the main surface of a semiconductor substrate; and a plurality of active regions adjacent to the field region, the active regions having a first active region formed with an n-type field effect transistor and a second active region formed with a p-type field effect transistor; wherein: an oxidation preventive film for suppressing oxidation of the semiconductor substrate in the trench is disposed on a lateral surface of the trench in the field region adjacent to the first active region on a side of the first active region which is located in a direction of connecting a source and a drain of the n-type field effect transistor; and the oxidation preventive film is not disposed on the lateral surface of the trench in the field region adjacent to the second active region which is located in a direction of connecting a source and a drain of the p-type field effect transistor.

The insulative layer can use a material having lower conductivity than that of the silicon substrate or the like located on the periphery thereof, for example, a silicon oxide layer. Further, the insulator is deposited over the oxidation preventive film. The direction of connecting the source and the drain can be, for example, the so-called channel direction. In this case, preferably, the stress exerted on the longitudinal direction of the gate electrode is a lower compression stress than the compression stress exerted in the source and drain direction of the gate electrode, or the stress exerted in the longitudinal direction of the gate electrode is a tensile stress and the stress exerted in the source-drain direction of the gate electrode is a compression stress.

(2) The semiconductor device described above is characterized in that the oxidation preventive film is a nitride film.

A silicon nitride film can be provided, for example, as the oxidation preventive film for preventing the substrate in the trench from oxidation, on the sidewall of the trench of the field region adjacent with the first active region having the p-type field effect transistor.

(3) The semiconductor device as described above is characterized in that the oxidation preventive film for suppressing the oxidation of the semiconductor substrate in the trench is disposed on the lateral surface of the trench in the field region adjacent to the second active region which is located in the longitudinal direction of the gate electrode situated between the source and the drain of the n-type field effect transistor.

The longitudinal direction of the gate electrode can be a direction perpendicular to (e.g., at a right angle to) the channel direction.

(4) The semiconductor device as described above is characterized in that the oxidation preventive film for suppressing the oxidation of the semiconductor substrate in the trench is disposed on the lateral surface of the trench in the field region adjacent to the second active region which is located in the longitudinal direction of the gate electrode located between the source and the drain of the p-type field effect transistor.

(5) A semiconductor device is characterized by comprising: a field region in which an insulative film is buried in the inside of a trench formed in a main surface of a semiconductor substrate; a first active region formed with an n-type field effect transistor; and a second active region formed with a p-type field effect transistor; wherein: an oxidation preventive film for suppressing oxidation of the semiconductor substrate in the trench is disposed on a lateral surface of the trench in the field region adjacent to the first active region on a side of the first active region which is located in a direction of connecting a source and a drain and in a direction perpendicular to the direction of connecting the source and drain of the n-type field effect transistor; and the oxidation preventive film is not disposed on the lateral surface of the trench in the field region adjacent with the second active region on a side of the second active region which is located in the direction of connecting a source and a drain of the p-type field effect transistor, and the oxidation preventive film for suppressing the oxidation of the semiconductor substrate in the trench is disposed on the lateral surface of the trench which is located in the direction perpendicular the direction of connecting the source and the drain.

(6) A semiconductor device is characterized by comprising: a field region in which an insulative film is buried in the inside of a trench formed in a main surface of a semiconductor substrate; and a plurality of active regions adjacent to the field region, the active region having a first active region formed with an n-type field effect transistor and a second active region formed with a p-type field effect transistor; wherein: an oxidation preventive film for suppressing oxidation of the semiconductor substrate in the trench is disposed on a lateral surface of the trench in the field region adjacent to the first active region on a side of the first active region which is located in a direction of connecting a source and a drain of the n-type field effect transistor; the active region having a third active region adjacent to the second active region by way of a field region and a fourth active region adjacent to the second active region from a side opposite to the side of the first active region; the third active region and the fourth active region are located in the direction of connecting the source and the drain of the p-type field effect transistor formed in the second active region; and a field region located between the second active region and the third active region and a field region located between the second active region and the fourth active region has an area of the same width within a range of fabrication dimensional error.

Further, "within a range of fabrication dimensional error", in other words, within the range of variations means that it is within the range of variations in usual fabrication, preferably, that the size may be identical at 0.05 µm or less. It is more desirable to be within the range of the fabrication scattering for the gate length Lg of the gate electrode in other circuit, for example, a memory cell or 2 NAND circuit in the semiconductor substrate to which the semiconductor device of this embodiment is formed. It is further preferably 0.05 µm or less and, further preferably, 0.03 µm or less.

(7) The semiconductor device described above is characterized in that the n-type field effect transistor and the p-type field effect transistor constitute a sense amplifier circuit.

(8) The semiconductor device described above is characterized in that the n-type field effect transistor and the p-type field effect transistor constitute a differential amplification circuit.

(9) The semiconductor device described above is characterized in that the n-type field effect transistor and the p-type field effect transistor constitute a NAND circuit.

(10) The semiconductor device described above characterized in that an oxide film is formed between the oxidation preventive film and the semiconductor substrate formed with the trench.

(11) A method of manufacturing a semiconductor device having an n-type field effect transistor and a p-type field effect transistor comprising the steps of: forming a pad oxide film on a semiconductor substrate; forming a nitride film on the pad oxide film; removing the pad oxide film and the nitride film in a region forming a field region adjacent to an active region thereby forming an opening; forming a trench on the semiconductor substrate in the opening; forming an oxidation preventive film for preventing oxidation of the semiconductor substrate in the trench on the lateral surface of the trench of the field region adjacent with the first active region surrounded with the trench, and depositing an insulative film over the oxidation preventive film thereby burying the trench; depositing the insulative film to bury the trench without disposing the oxidation preventive film to the lateral surface of the field region adjacent with the second active region surrounded with the trench; removing the pad oxide film and the nitride film in the first and the second active regions; and forming an n-type field effect transistor in the first active region, and forming a p-type field effect transistor in the second active region, in which the lateral surface of the trench not disposed with the oxidation preventive film is disposed so as to be situated in the direction of connecting the source and the drain of the p-type field effect transistor.

(12) The method of manufacturing a semiconductor device described above is characterized by further including the steps of forming an oxidation preventive film on the lateral of the trench of the field region adjacent with the first active region and to the lateral surface of the trench in the field region adjacent with the second active region; and removing the oxidation preventive film on the lateral surface of the trench in the field region adjacent to the second active region.

The present inventors have measured the stress dependency of the drain current in the field effect transistor and found that the stress dependency is different between the n-type channel field effect transistor and the p-type channel field effect transistor. FIG. 4 shows the experimental results of the stress dependency of the drain current in the n-type channel field effect transistor and the p-type channel field effect transistor. A stress loading experiment is performed on transistors formed on the Si (001) face such that the drain current flows parallel with the <110> axis. The gate electrode of the evaluated field effect transistors is 0.2 µm. Further, the stress with respect to the direction includes an in-channel plane axis stress parallel with the drain current (hereinafter referred to as channel-parallel-stress) and an in-channel plane axis stress orthogonal to the drain current (hereinafter referred to as channel-orthogonal-stress) flowing through the channel of the field effect transistor. A positive stress sign represents tensile stress and negative stress sign represents a compression stress. It has been demonstrated that for the n-type channel field effect transistor, the drain current increases relative to the tensile stress (at about 4%/100 MPa under the stress parallel with the channel and at about 2%100 MPa under the stress orthogonal to the channel). On the other hand, for the p-type channel field effect transistor, the drain current increases in the direction orthogonal to the channel (at about 4%/100 MPa) but the drain current decreases in the direction parallel with the channel (at about 7%/100 MPa).

The stress and the strain are in a relation proportional to each other so long as it is concerned with the region of elastic deformation. The experimental results described above shows that the drain current is increased when tensile stress is applied parallel with the channel to the n-type channel field effect transistor. This is probably because the crystal lattice of silicon constituting the channel is strained in the tensile direction parallel with and in the channel plane compared with that before loading stress, increasing the mobility of electrons. That is, the present inventors have demonstrated that the drain current characteristics of the n-type channel and the p-type channel field effect transistor depend on the direction of the strain caused in the crystal lattice of silicon constituting the channel and the absolute value thereof.

The effect of the stress generated in the field effect transistor on the transistor characteristics has been studied by focusing on, for example, the stress dependency of the mutual conductance (Gm) as one of the characteristics of the field effect transistor (Akemi Hamada, et al., IEEE trans. Electron Devices, vol. 38, No. 4, pp. 895–900, 1991). However, fluctuation of the characteristics of the field effect transistor due to the stress has not been attached much importance. This is probably because the sensitivity of the transistor itself to the stress is low. FIG. 5 comparatively shows the experimental results of the stress dependence of Gm (gate length: 2 μm) in the above-mentioned literature (Akemi Hamada, et al., IEEE trans. Electron Devices, vol. 38, No. 4, pp. 895–900, 1991) and the experimental results of the stress dependency of Gm performed by the present inventors (gate length: 0.2 μm). The comparison was made for the load stress in the direction parallel with the channel for the n-type channel field effect transistors. The transistor of the generation where a gate length is 0.2 μm is about four times the transistor in the generation where the gate length was 2 μm in the dependence of Gm on the stress. That is, this shows that the sensitivity of the transistor characteristics to the stress increases along with the progress of the transistor generation.

According to the invention, in the semiconductor device having an n-type channel field effect transistor and the p-type channel field effect transistor, the n-type channel and the p-type channel field effect transistors are fabricated in a different manner in their structures such that the compression stress generated in the channel portion of the n-type channel is decreased or transformed to the tensile stress, and the state of stress in the direction orthogonal to the channel direction is transformed to the stress in the tensile direction compared with the parallel direction in the p-type channel transistor, or such that the entire portion is in the state of the compression stress.

Since the drain current characteristics can be improved both for the n-type channel and the p-type channel transistors, a semiconductor device excellent in the performance as a whole can be provided.

Further, since silicon-germanium is not used in the semiconductor device, the high reliable semiconductor device with suppressed dislocation or the like can be provided.

According to the invention, a semiconductor device having an n-type channel field effect transistor and a p-type channel field effect transistor, which is excellent in drain current characteristic, can be provided. Further, a semiconductor device having an n-type channel and a p-type channel transistor that are excellent in drain characteristic can be provided.

In particular, the invention is preferably applied to a semiconductor device having a complementary type field effect transistor comprising an n-type channel field effect transistor and a p-type channel field effect transistor.

DESCRIPTION OF THE ACCOMPANYING DRAWINGS

BEST MODE FOR CARRYING OUT THE INVENTION

Preferred embodiments of the present invention are to be described below. The invention is not restricted to the following embodiments but is applicable to other embodiments.

Figure 1:
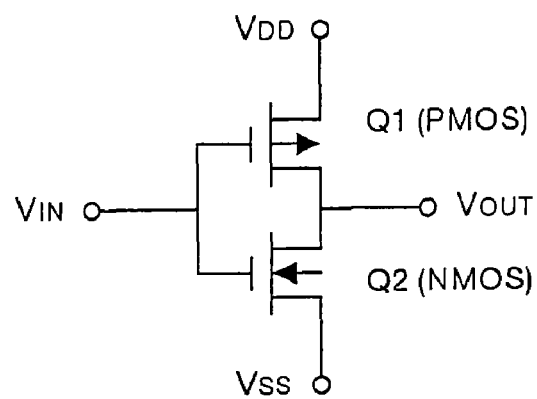
FIG. 1 shows an inverter circuit of a first embodiment according to the present invention.
Figure 2:
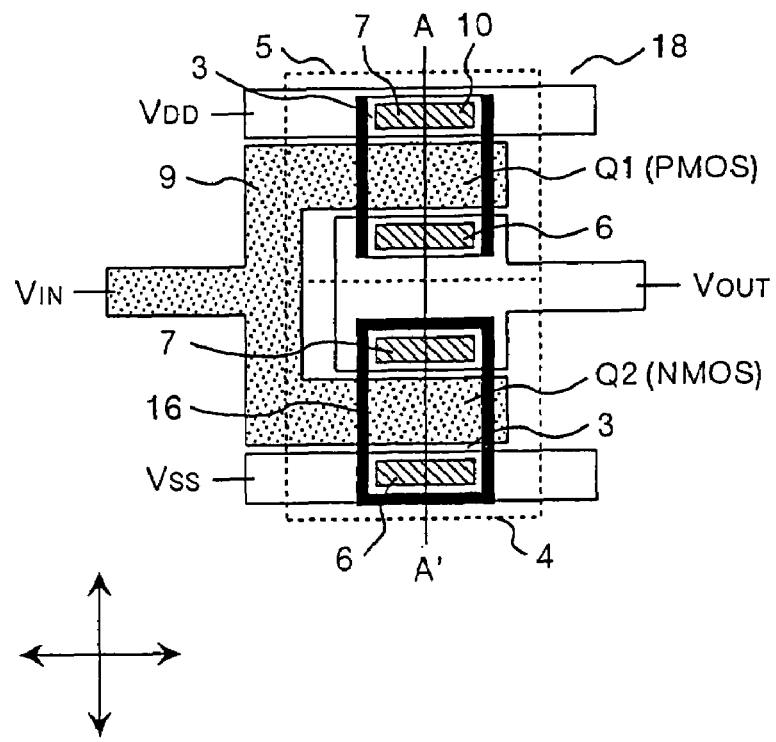
FIG. 2 shows a layout of the inverter circuit according to the first embodiment of the invention.

The invention is to be described by way of the first embodiment with reference to FIG. 1. FIG. 1 is an inverter circuit diagram of this embodiment; FIG. 2 is a layout of the inverter circuit; and FIG. 3 is a cross-sectional view taken along line A–A' of FIG. 2.

As shown in FIG. 2, this embodiment comprises a p-type channel field effect transistor Q1, an n-type channel field effect transistor Q2 and interconnections for connecting the transistors electrically.

The n-type channel field effect transistor Q2 formed on a substrate (sub1) 1 comprises an n-type source (soce 1) 6, a drain (drain 1) 7, a gate electrode (poly-Si) 9 and a gate oxide film (gato-ox) 8 formed on a p-type well layer (pwell) 4. Further, the p-type channel field effect transistor Q1 comprises a p-type source (soce) 6, a drain (drain) 7, a gate electrode (poly-Si) 9 and a gate oxide film (gato-ox) 8 in the same manner as that for the n-channel formed in an n-type well layer (nwell) 5. Further, to connect the transistors for constituting a circuit, contacts (contact) 10 and interconnections (AL) 18 are disposed. Further, double head arrows are shown to denote the longitudinal direction of the gate electrode and the direction of source-drain (channel direction) crossing (perpendicular to) the direction of the gate electrode in FIG. 2.

Figure 3:
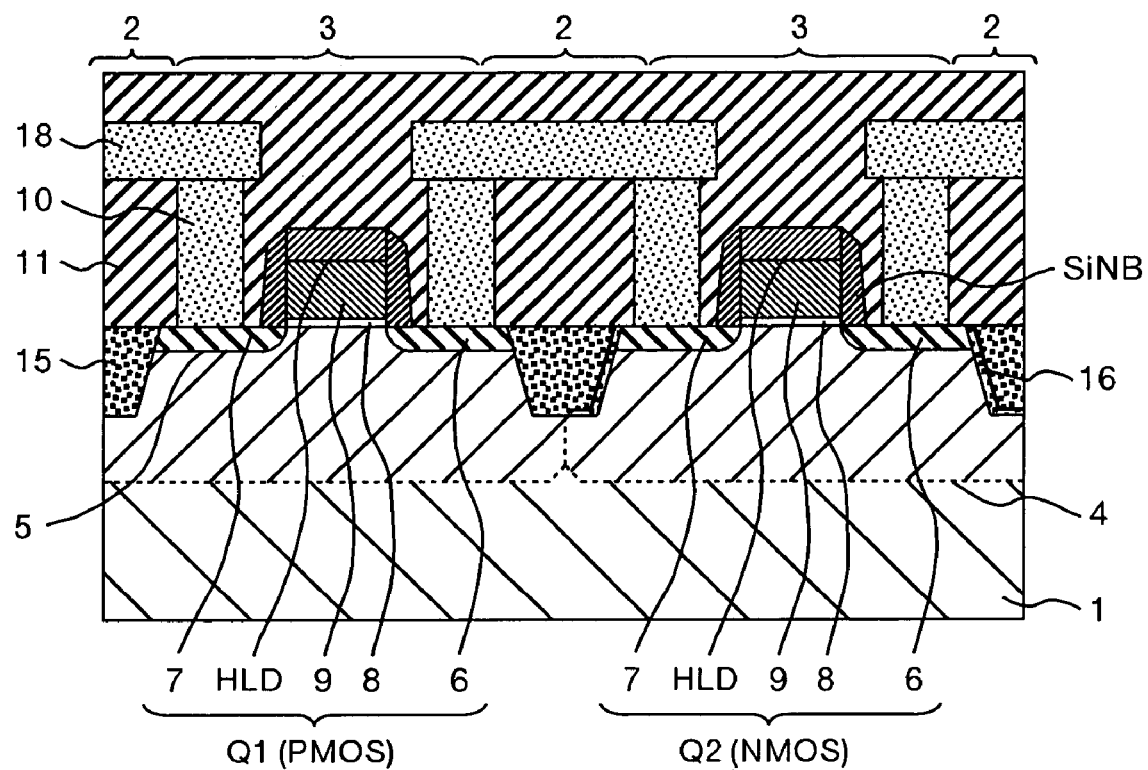
FIG. 3 shows a cross-sectional view of the inverter circuit layout according to the first embodiment of the invention.

Further, as shown in FIG. 3, a shallow trench isolation (STI) formed by filling a trench with a thick oxide film ($SiO_2B$) 15 surrounds the periphery of each of transistors Q1 and Q2 for electrically isolating them (the region in which the field effect transistor is formed is hereinafter referred to as an active region "active"). A silicon nitride film (SiNA) 16 is deposited on the trench sidewall in STI adjacent to the n-type channel field effect transistor Q2 not only in the channel direction but also in the direction perpendicular to the channel direction. Here, the channel direction is a direction connecting the source 6 and drain 7, that is, a direction perpendicular to the longitudinal direction of the gate electrode between the source 6 and drain 7. In addition, the direction crossing the channel direction is a longitudinal direction of the gate electrode situated between the source 6 and drain 7. On the other hand, a silicon nitride film (SiNA) 16 is formed on the trench sidewall of the p-type channel field effect transistor Q1 only in the direction perpendicular to the channel direction. Then, the silicon oxide film (SiO$_2$B) fills the trench thereover for isolation. The silicon nitride film (SiN) is not disposed on the trench sidewall situating in the channel direction.

The function and the effect of the semiconductor device according to this embodiment is to be described. In the development of semiconductor devices such as LSIs, an improvement in the drain current in the field effect transistor (an increase in the drain current) has proceeded year by year. The present inventors have demonstrated that the drain current changes depending on the stress given to the transistor and have found a method of improving the drain current in both of an n-type channel and a p-type channel transistor of a complementary field effect transistor having the p-type channel field effect and the n-type channel field effect transistor.

Figure 4:
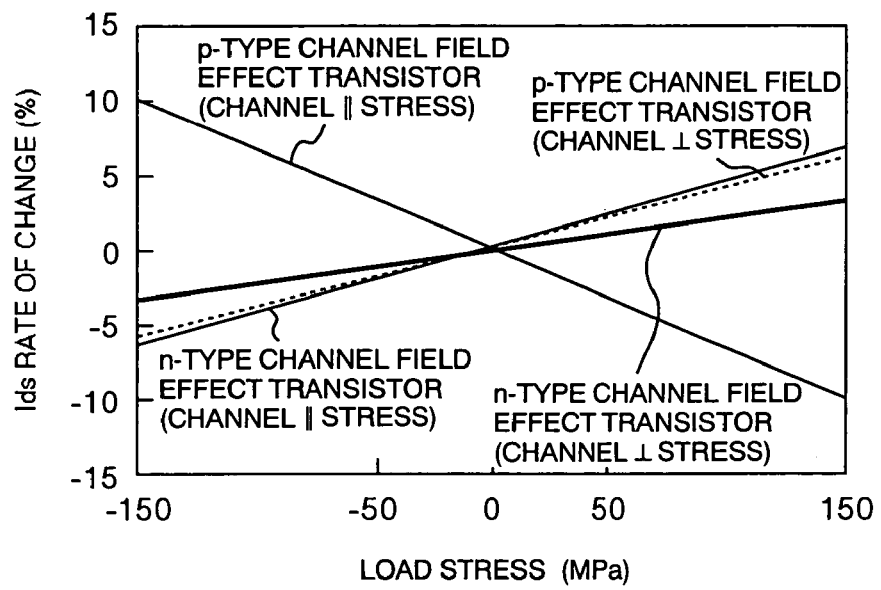
FIG. 4 is a graph showing the experimental results of the stress dependency of the drain current in n-type channel and p-type channel field effect transistors.
Figure 5:
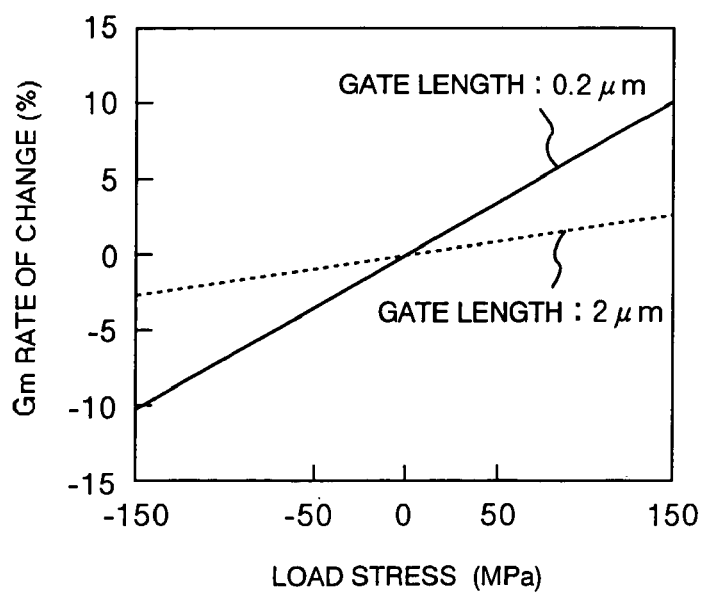
FIG. 5 is a graph showing the experimental results of the difference of the dependency of the mutual conductance (Gm) on the stress depending on the generations of the field effect transistor.

FIG. 4 shows the stress dependency of the drain current in the field effect transistor. The figure demonstrates that the drain current increases in the n-type channel field effect transistor by the tensile stress, whereas the drain current increases in the p-type channel field effect transistor by the compression stress.

Figure 6:
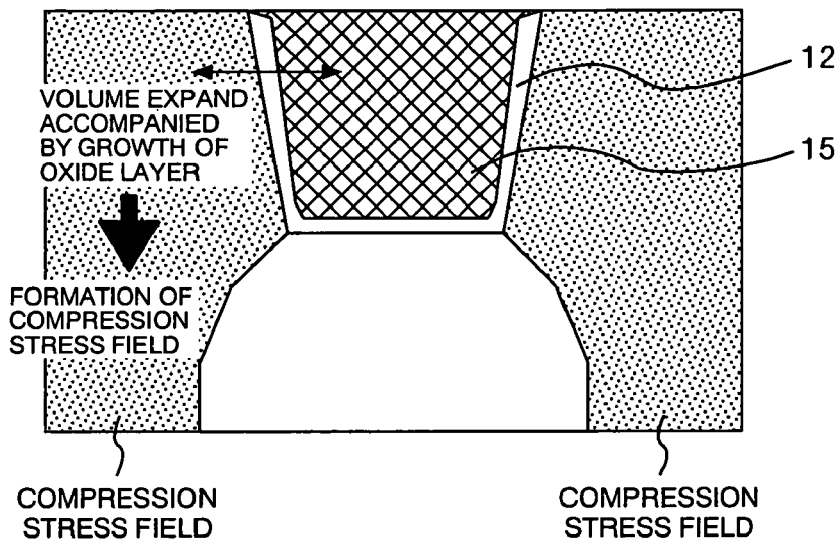
FIG. 6 is a conceptional diagram explaining the generation of stress in an STI structure.
Figure 7:
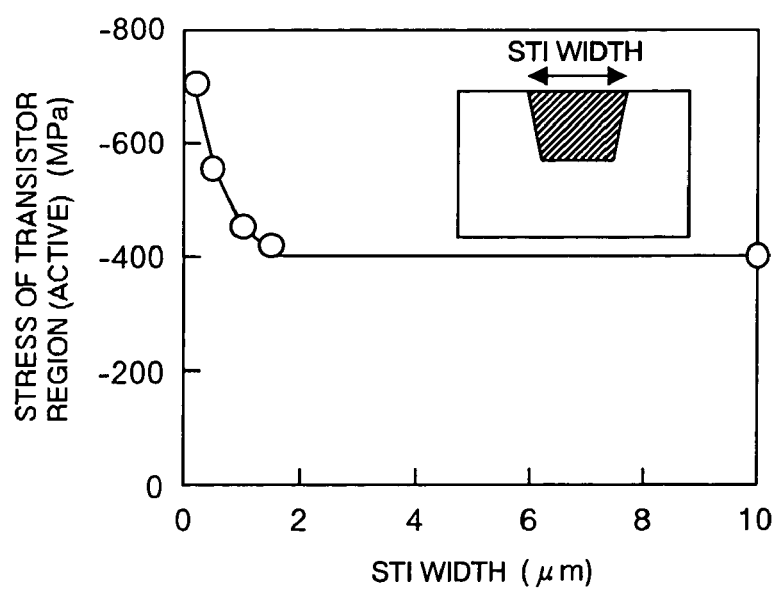
FIG. 7 is a graph showing the analysis of the dependence of the oxidation-induced stress on the STI width.

As shown in FIG. 6, STI has a structure of engraving a trench in a silicon substrate and burying a silicon oxide film (SiO$_2$B) 15 inside the trench and, as shown in FIG. 3, STI is formed adjacent to the transistor. Usually, the transistor is formed after the formation of STI. A number of oxidation steps including the step for the gate oxide film are present in the formation of the transistor. In the oxidation step, since oxygen as oxidizing species diffuses in the oxide film (SiO$_2$B) 15 inside the trench of STI, the oxide film SiO$_2$C is grown also on the trench sidewall. Upon transformation of a film from silicon to silicon oxide, the film causes approximately twice volume expansion. Since the volume expansion is constrained by the buried oxide film, a compression stress field is formed as a reaction thereof in a transistor-forming region as shown by hatched lines in FIG. 6. When such compression stress field is formed in the region forming the n-type channel field effect transistor, drain current lowers as shown in FIG. 4. FIG. 7 shows an example of analyzing the state of the compression stress by use of an oxidation simulator in which the compression stress value increases as the STI width decreases. This is because the compression stresses generated in the trench sidewall (both sides) increases by the interference in the trench due to the decreased STI width. That is, this means that electrical characteristics of the transistors Q1 and Q2 change depending on the width of STI around the transistors Q1 and Q2. While it is probable that the problem can be overcome by the layout for all the circuits with a constant STI width, it is not practical because of various restrictions on the layout. In view of the above, in the invention, occurrence of the compression stress can be suppressed by depositing a silicon nitride film as a mask for oxidation on the lateral surface of the trench for preventing the substrate on the trench side wall from oxidation in order not to oxidize the trench side wall even when the oxidation species are diffused in the STI region.

The drain current in the p-type channel field effect transistor can be increased by applying a stress in the compression direction parallel to the channel while applying a stress in the tensile direction perpendicular to the channel in view of FIG. 4. Then, in order to obtain such a stress field, the silicon nitride film is deposited to the STI trench sidewall only in the direction parallel to the channel.

Further, in the n-type channel field effect transistor, since the drain current decreases by the compression stress irrespective of the direction of the stress parallel or perpendicular to the channel, the silicon nitride film is deposited on the sidewall of the STI trench surrounding the n-type channel field effect transistor.

Accordingly, in the semiconductor device having the n-type channel field effect transistor and the p-type channel field effect transistor, the stress caused by the STI structure (STI stress) shown above is controlled depending on the p-type channel field effect transistor and the n-type channel field effect transistor, so that the improvement in the drain current both for the n-type channel and the p-type channel transistor can be promised. Consequently, the performance of the entire circuit can be enhanced.

FIG. 3 is a cross-sectional view taken along line A–A' of FIG. 2. The well regions 4 (pwell) and 5 (pwell) are formed on the silicon substrate (sub) 1 and STI is formed for trench isolation at the boundary for each of the well regions. Further, the silicon nitride (SiNA) 16 is formed as an oxidation preventive mask inside the trench of STI surrounding the n-type channel field effect transistor Q2. Then, trench isolation SiO$_2$B 15 can be deposited thereover. The n-type channel field effect transistor Q2 comprises a source (soce 1) 6, a drain (drain 1) 7, and a gate electrode (gato-ox) 9. In addition, a p-type channel field effect transistor Q1 comprises a source (soce) 6, a drain (drain) 7, and a gate electrode (gato-ox) 9. They are connected by way of contacts 10 to interconnections (AL) 18 to constitute an inverter circuit.

Figure 8:
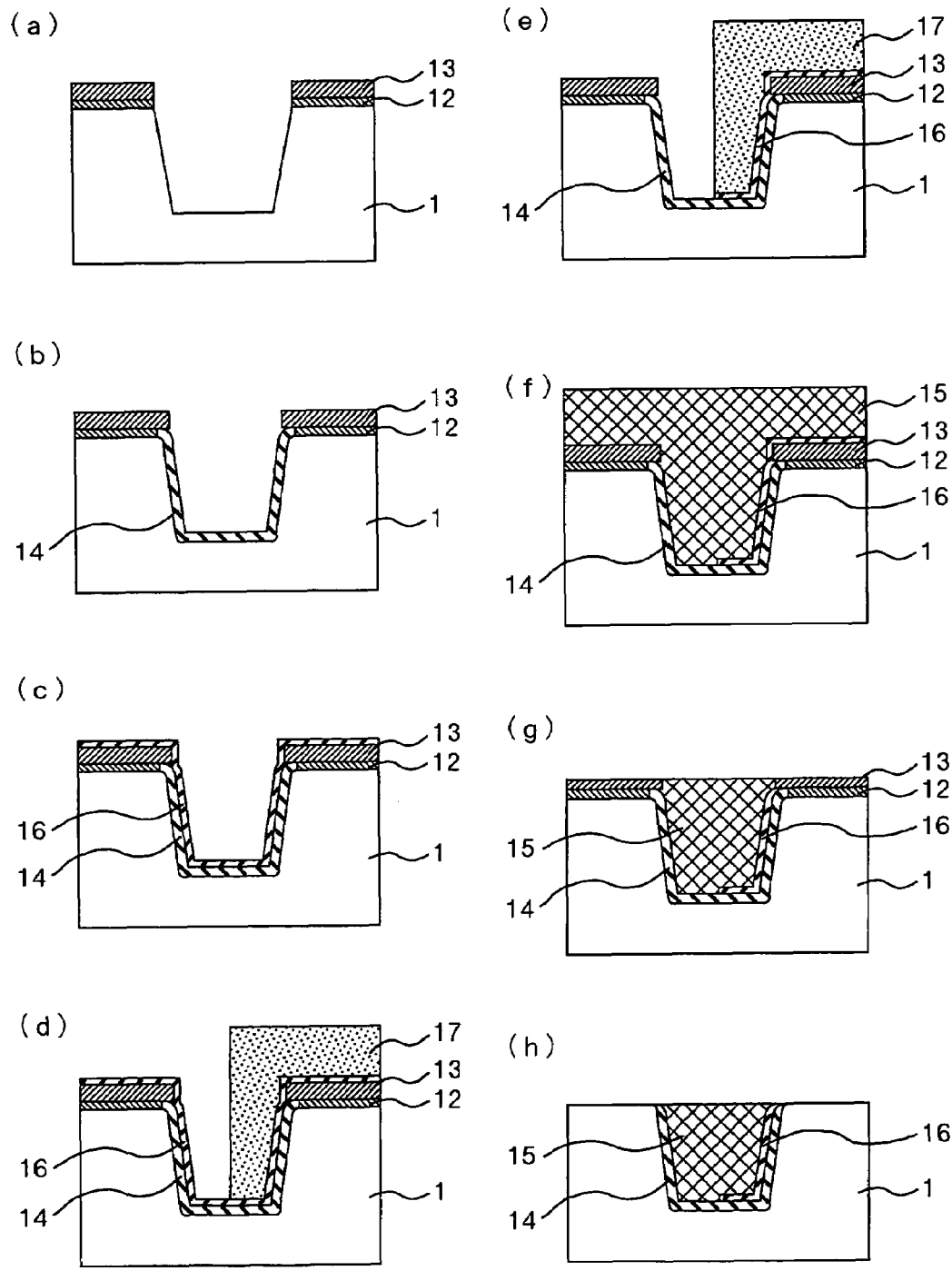
FIGS. 8A to 8H are cross-sectional views showing a method of depositing a silicon nitride film inside the STI trench.

The method of depositing the silicon nitride film in the STI structure can be performed by the method as shown in FIG. 8. The formation method is to be described.

(1) A pad oxide film (SiO$_2$) 12 is formed on the silicon substrate (sub) 12. A first silicon nitride film (SiN) 13 is formed the pad oxide film 12. The first silicon nitride film (SiN) 13 and the pad oxide film (SiO$_2$) 12 are removed at desired positions to expose the surface of the silicon substrate (sub) 1. Subsequently, a predetermined trench is formed using the first silicon nitride film (SiN) 13 as a mask (FIG. 8A).

(2) The surface of the silicon substrate (sub) 1 in the trench is oxidized to form an oxide film (SiO$_2$A) 14 (FIG. 8B).

(3) A second silicon nitride film (SiNA) 16 is formed on the exposed surface (FIG. 8C).

(4) A resist film (resist) 17 is coated over the entire substrate, and its desired portion is removed by exposure to light (FIG. 8D).

(5) A portion of the second silicon nitride film (SiNA) 16 is removed by isotropic dry etching using the resist film (resist) 17 as a mask (FIG. 8E) (an active side trench wall opposite to the active region formed with the n-type field effect transistor).

(6) The resist film (resist) 17 is removed and the oxide film (SiO$_2$B) 15 is buried inside the trench (FIG. 8F).

(7) The oxide film (SiO$_2$B) 15 formed over the first silicon nitride film (SiN) 13 is removed for planarization (FIG. 8G).

(8) The first silicon nitride film (SiN) 13, and the pad oxide film (SiO$_2$) 12 are removed (FIG. 8H).

According to the method described above, the silicon nitride film can be inwardly deposited on the sidewall only on one side of the STI trench.

(9) Then, a device comprising the gate oxide film 8 and the gate electrode 9, and interconnections also shown in FIG. 3 are formed over the exposed silicon substrate 1.

Figure 9:
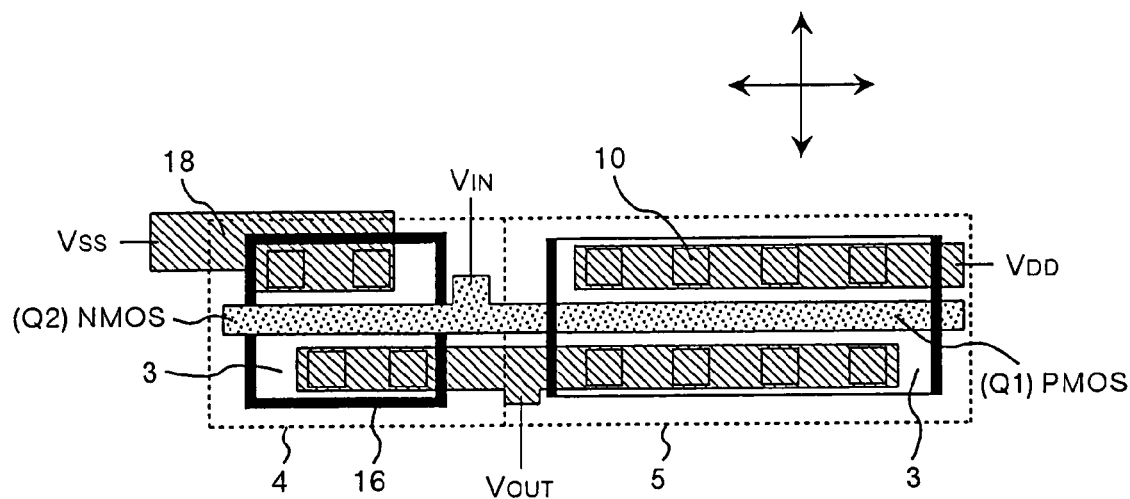
FIG. 9 shows another layout of the inverter circuit according to the first embodiment of the invention.

The layout for the inverter circuit in FIG. 2 can be modified to that as shown in FIG. 9. Further, when the invention is applied to a 2-input NAND shown in FIG. 10, its layout is as shown in FIG. 11.

Figure 12:
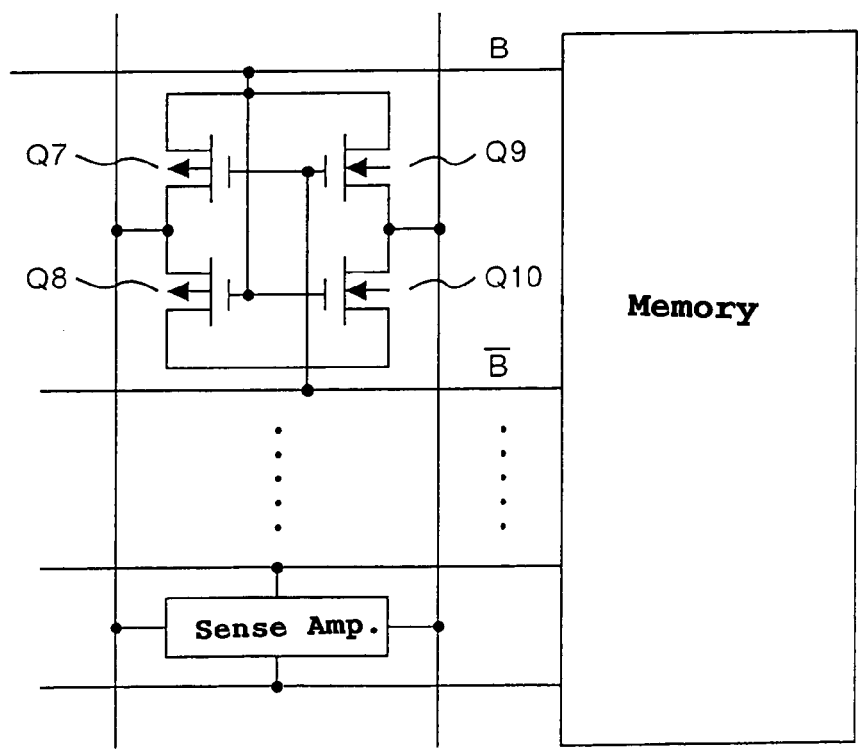
FIG. 12 shows a sense amplifier circuit.
Figure 13:
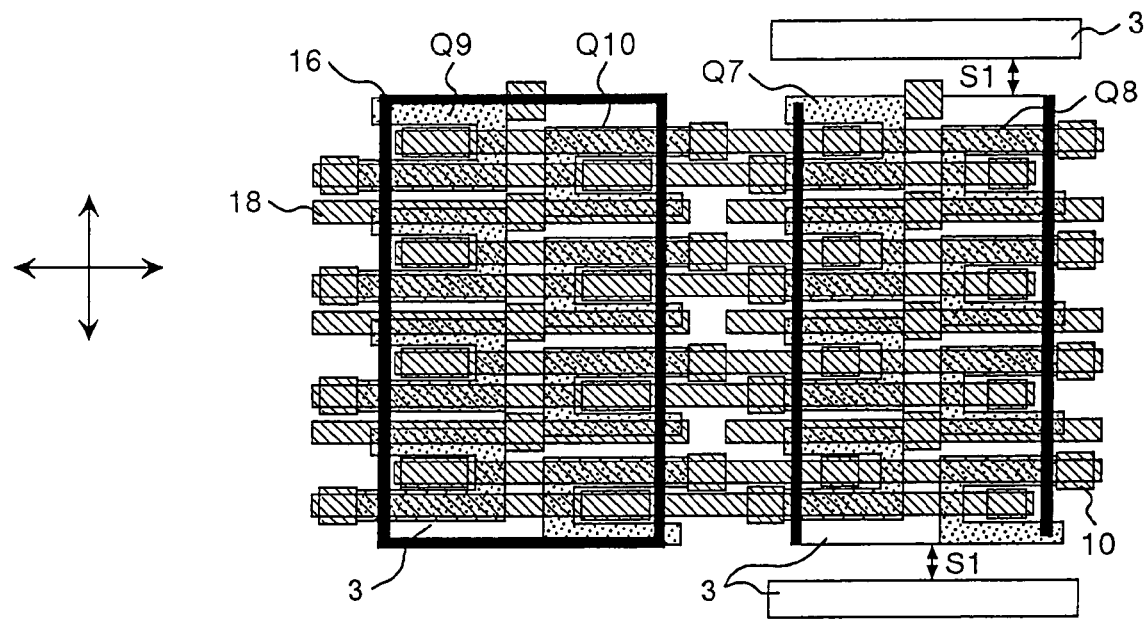
FIG. 13 is a layout in a case of applying the invention to the sense amplifier circuit.

Further, two transistors (Q7 and Q8) in the sense amplifier circuit of FIG. 12 should be identical in characteristics. In such a case, its layout is as shown in FIG. 13. In this case, STI stress in the direction parallel with the channel of the transistors Q7 and Q8 are preferably identical between the two transistors. Therefore, it is preferred to dispose active regions by way of STI so as to be adjacent to the transistors Q7 and Q8. It is effective that the STI stress exerted on the transistors Q7 and Q8 is high compression stress in view of FIG. 4 in order to improve the drain current. For this end, it is preferred that STI is fabricated to have a minimum width S1 during the LSI forming process. The minimum width Si is less than the distance between the active region having the transistors Q7 and Q8 and the corresponding active region having transistors Q9 and Q10. It can be, for example, formed to 0.25 μm or less.

As shown in FIG. 4, in the p-type channel field effect transistor, to maximize the drain current, it is effective to change the direction of stress remaining in the directions parallel and perpendicular to the channel. However, a change in the drain current due to the stress is greater in the case of applying the stress in parallel with the channel (about 4%/100 MPa) than in the case of applying the stress crossing to the channel (about 2%/100 MPa). Accordingly, the drain current can be increased (4−2=2%) in total, by applying the compression stress to the region for forming the p-type channel field effect transistor (irrespective of the channel direction). Accordingly, the improvement in the drain current for both the n-type channel and p-type channel transistors can also be promised by forming the silicon nitride film on the trench side wall only for STI adjacent to the n-type channel field effect transistor so as to surround the transistor as shown in the drawing. Characteristics as the entire circuit can be improved.

Figure 10:
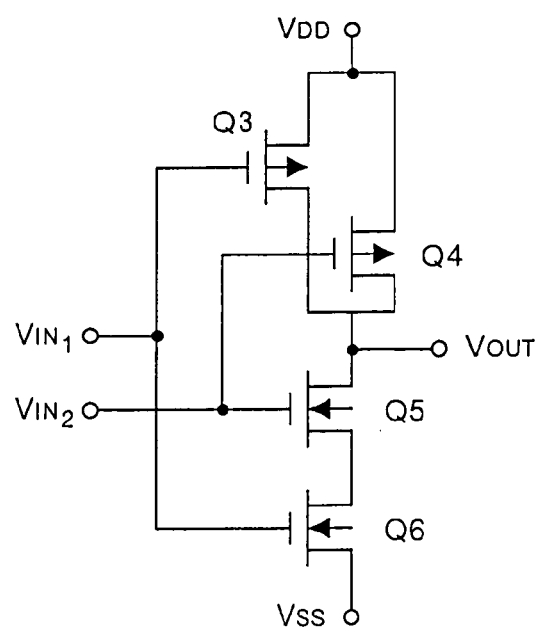
FIG. 10 shows a 2-input NAND circuit.
Figure 11:
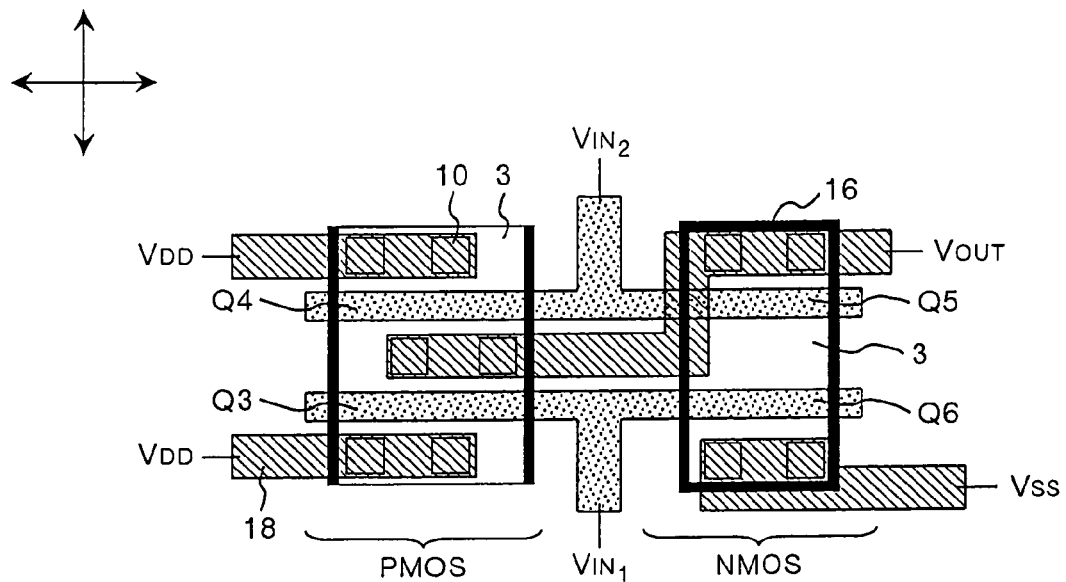
FIG. 11 is a layout in a case of applying the invention to the 2-input NAND circuit.
Figure 14:
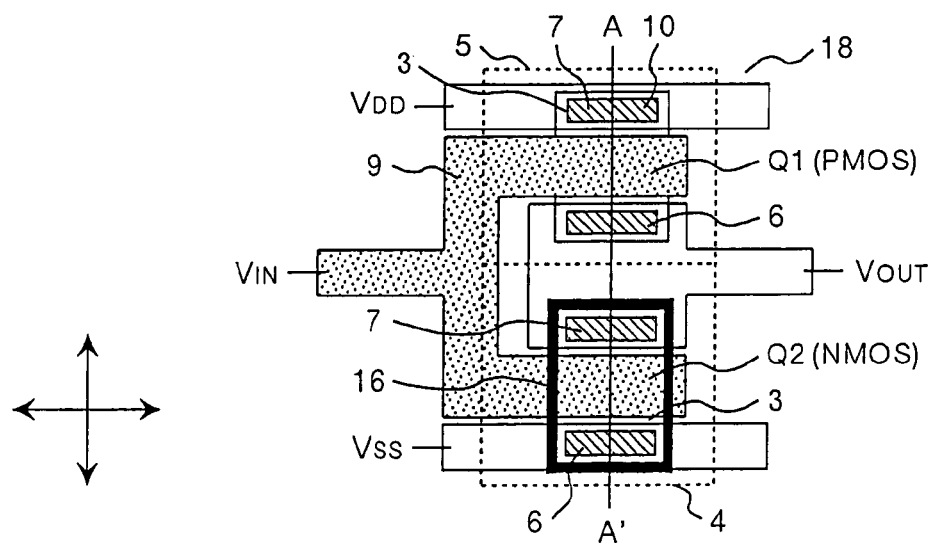
FIG. 14 shows a layout of an inverter circuit according to a second embodiment of the invention.
Figure 15:
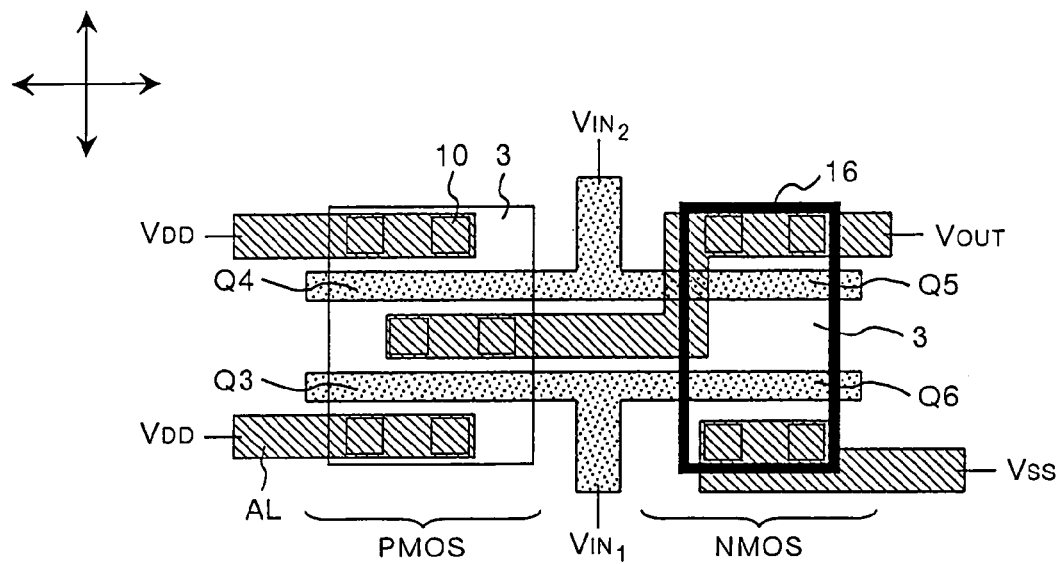
FIG. 15 shows a layout of an 2-input NAND circuit according to a second embodiment of the invention.
Figure 16:
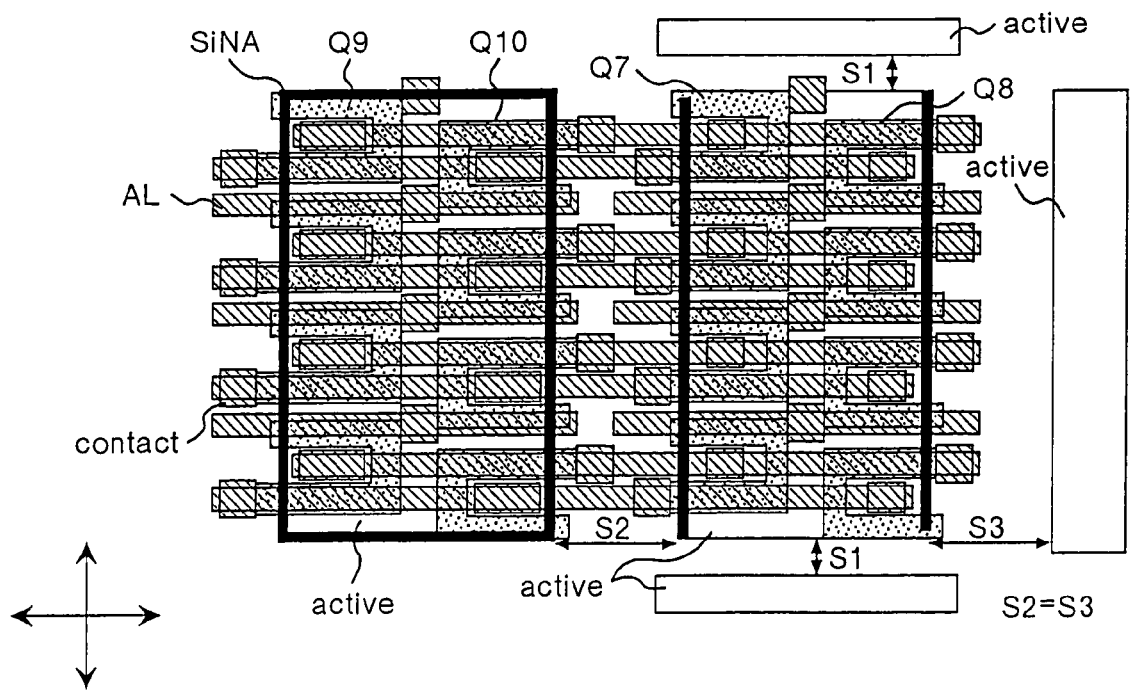
FIG. 16 shows a layout of the sense amplifier circuit according to the second embodiment of the invention.

The layout of applying the method described above to the inverter circuit in FIG. 1, the 2-input NAND circuit in FIG. 10 and the sense amplifier circuit in FIG. 12 are as shown in FIGS. 14, 15, and 16, respectively.

For easy understanding of the drawings, principal references are to be explained below.

Silicon substrate-1, shallow trench isolation-2, transistor forming region (active)-3, p-type well-4, n-type well-5, source (soce, soce 1)-6, drain (drain, drain 1)-7, gate oxide film-8, gate electrode-9, contact-10, interlayer insulative film (TEOS)-11, pad oxide film-12, first silicon nitride film-13, oxide film-14, buried oxide film-15, second silicon nitride film-16, resist-17, interconnection-18, Q1, Q3, Q4, Q7, Q8-p-type channel field effect transistor, Q2, Q5, Q6, Q9, Q10-n-type channel field effect transistor

INDUSTRIAL APPLICABILITY

According to the present invention, a semiconductor device having an n-type channel field effect transistor and a p-type channel field effect transistor excellent in current characteristics can be provided.

What is claimed is:

1. A semiconductor device comprising:
 a field region in which an insulative film is buried to the inside of a trench formed to the main surface of a semiconductor substrate; and
 a plurality of active regions adjacent to the field region, the active regions having a first active region formed with an n-type field effect transistor and a second active region formed with a p-type field effect transistor;
wherein:
 an oxidation preventive film for suppressing oxidation of the semiconductor substrate in the trench is disposed on a lateral surface of the trench in the field region adjacent to the first active region on a side of the first active region which is located in a direction of connecting a source and a drain of the n-type field effect transistor;
 the oxidation preventive film is not disposed on the lateral surface of the trench in the field region adjacent to the second active region which is located in a direction of connecting a source and a drain of the p-type field effect transistor and
 the oxidation preventive film for suppressing the oxidation of the semiconductor substrate in the trench is disposed on the lateral surface of the trench in the field region adjacent to the second active region which is located in a longitudinal direction of a gate electrode located between the source and the drain of the p-type field effect transistor.

2. The semiconductor device according to claim 1, wherein the oxidation preventive film is a nitride film.

3. The semiconductor device according to claim 1, wherein the oxidation preventive film for suppressing the oxidation of the semiconductor substrate in the trench is disposed on the lateral surface of the trench in the field region adjacent to the second active region which is located in the longitudinal direction of a gate electrode located between the source and the drain of the n-type field effect transistor.

4. A semiconductor device according to claim 1, wherein the n-type field effect transistor and the p-type field effect transistor constitute a sense amplifier circuit.

5. A semiconductor device according to claim 1, wherein the n-type field effect transistor and the p-type field effect transistor constitute a differential amplification circuit.

6. A semiconductor device according to claim 1, wherein the n-type field effect transistor and the p-type field effect transistor constitute a NAND circuit.

7. A semiconductor device according to claim 1, wherein an oxide film is formed between the oxidation preventive film and the semiconductor substrate formed with the trench.

8. A semiconductor device comprising:
 a field region in which an insulative film is buried in the inside of a trench formed in a main surface of a semiconductor substrate;
 a first active region formed with an n-type field effect transistor; and
 a second active region formed with a p-type field effect transistor;

wherein:
an oxidation preventive film for suppressing oxidation of the semiconductor substrate in the trench is disposed on a lateral surface of the trench in the field region adjacent to the first active region on a side of the first active region which is located in a direction of connecting a source and a drain and in a direction perpendicular to the direction of connecting the source and drain of the n-type field effect transistor; and the oxidation preventive film is not disposed on the lateral surface of the trench in the field region adjacent with the second active region on a side of the second active region which is located in the direction of connecting a source and a drain of the p-type field effect transistor, and the oxidation preventive film for suppressing the oxidation of the semiconductor substrate in the trench is disposed on the lateral surface of the trench which is located in the direction perpendicular the direction of connecting the source and the drain.

9. A semiconductor device comprising:
a field region in which an insulative film is buried in the inside of a trench formed in a main surface of a semiconductor substrate; and
a plurality of active regions adjacent to the field region, the active region having a first active region formed with an n-type field effect transistor and a second active region formed with a p-type field effect transistor;
wherein:
an oxidation preventive film for suppressing oxidation of the semiconductor substrate in the trench disposed on a lateral surface of the trench in the field region adjacent to the first active region on a side of the first active region which is located in a directio of connecting a source and a drain of the n-type field effect transistor;
the active region having a third active region adjacent to the second active region by way of a field region and a fourth active region adjacent to the second active region from a side opposite to the side of the first active region;
the third active region and the fourth active region are located in the direction of connectin the source and the drain of the p-type field effect transistor formed in the second active region; and
a field region located between the second active region and the third active region and a field region located between the second active region and the fourth active region has an area of the same width within a range of fabrication dimensional error.

10. A method of manufacturing a semiconductor devices, including an n-type field effect transistor and a p-type field effect transistors, comprising the steps of:
forming a pad oxide film on a semiconductor substrate;
forming a nitride film on the pad oxide film;
removing the pad oxide film and the nitride film in a region fanning a field region adjacent to an active region thereby forming an opening;
forming a trench in the semiconductor substrate in the opening;
forming an oxidation preventive film for preventing oxidation of the semiconductor substrate in the trench on a lateral surface of the trench of the field region adjacent to the first active region surrounded with the trench, and depositing an insulative film on the oxidation preventive film thereby burying the trench;
depositing the insulative film thereby burying the trench with the oxidation preventive film disposed on the lateral surface of the trench in the direction of crossing the direction connecting a source and a drain of the p-type field effect transistor in the field region adjacent to the second active region surrounded with the trench, and without disposing the oxidation preventive film on the lateral surface of the trench in the direction connecting a source and a drain of the p-type field effect transistor in the field region adjacent to the second active region surrounded with the trench;
removing the pad oxide film and the nitride film in the first and the second active regions; and
forming an n-type field effect transistor in the first active region, and forming a p-type field effect transistor in the second active region.

11. A method of manufacturing a semiconductor device according to claim 10, further comprising the steps of:
forming an oxidation preventive film on a lateral surface of the trench of the field region adjacent to the first active region and to a lateral surface of the trench in the field region adjacent to the second active region; and
removing the oxidation preventive film on the lateral surface of the trench in the field region adjacent to the second active region.

* * * * *